(12) United States Patent
Lu

(10) Patent No.: US 10,630,306 B2
(45) Date of Patent: Apr. 21, 2020

(54) METHOD AND SYSTEM FOR SPECTRAL LEAKAGE REMOVAL IN DAC TESTING

(71) Applicant: Advantest (Singapore) Pte. Ltd., Singapore (SG)

(72) Inventor: Ming Lu, Shanghai (CN)

(73) Assignee: ADVANTEST CORPORATION, Tokyo (JP)

(*) Notice: Subject to any disclaimer, the term of this patent is extended or adjusted under 35 U.S.C. 154(b) by 586 days.

(21) Appl. No.: 14/482,861

(22) Filed: Sep. 10, 2014

(65) Prior Publication Data

US 2015/0323640 A1 Nov. 12, 2015

(51) Int. Cl.
*H03M 1/10* (2006.01)
*G01R 35/00* (2006.01)
*H03M 1/66* (2006.01)

(52) U.S. Cl.
CPC ........ *H03M 1/1085* (2013.01); *G01R 35/005* (2013.01); *H03M 1/66* (2013.01)

(58) Field of Classification Search
USPC .......................................................... 370/210
See application file for complete search history.

(56) References Cited

U.S. PATENT DOCUMENTS

| | | | | |
|---|---|---|---|---|
| 4,912,422 A * | 3/1990 | Kobayashi | .......... | H04L 27/2332 329/306 |
| 7,620,125 B1 * | 11/2009 | Chang | ................. | H04L 27/0014 375/316 |
| 2002/0005794 A1 * | 1/2002 | Yamaguchi | ......... | H03M 1/1085 341/120 |
| 2012/0089337 A1 * | 4/2012 | Vassallo | ............... | G01V 99/005 702/17 |
| 2013/0147646 A1 * | 6/2013 | Sestok | ................ | H03M 7/3062 341/155 |
| 2013/0179106 A1 * | 7/2013 | Crupi | ..................... | G01D 3/032 702/87 |
| 2014/0016792 A1 * | 1/2014 | Christoph | ............... | G10L 19/06 381/61 |

(Continued)

OTHER PUBLICATIONS

Dr. Fang Xu, "Algorithm to Remove Spectral Leakage, Close-in Noise, and its Application to Converter Test", Apr. 24-27, 2006, IMTC 2006—Instrumentation and Measurement Technology Conference, pp. 1038-1042.*

(Continued)

*Primary Examiner* — Alexander Satanovsky
*Assistant Examiner* — Brent A. Fairbanks

(57) ABSTRACT

System and method for processing a signal sampled from an output of a digital-analog converter. The method comprises: (a) transforming the input signal from time domain to frequency domain to obtain a signal having a plurality of bins; (b) estimating properties of a largest amplitude bin, except for direct current (DC) bin, in the input signal; (c) performing signal reconstruction in time domain based on the estimated properties to generate a reconstructed signal; (d) subtracting the estimated signal from the input signal to get a residual signal; (e) repeating steps (a)-(d) till a predetermined number of bins have been processed; (f) adding all the reconstructed signals and the last residual signal together to generate a sum signal; and (g) transforming the sum signal from the time domain to the frequency domain.

11 Claims, 16 Drawing Sheets

(56) References Cited

U.S. PATENT DOCUMENTS

2014/0079248 A1* 3/2014 Short ................. G10L 21/0272
  381/119
2015/0137865 A1* 5/2015 Tohzaka .................... H03L 7/06
  327/163

OTHER PUBLICATIONS

Dr. Fang Xu, "Algorithm to Remove Spectral Leakage, Close-in Noise, and its Application to Converter Test", Apr. 24-27, 2006, IMTC 2006—Instrumentation and Measurement Technology Conference, pp. 1038-1042 (Year: 2006).*

* cited by examiner

METHOD AND SYSTEM FOR SPECTRAL LEAKAGE REMOVAL IN DAC TESTING

CROSS REFERENCE

This application claims the priority of Chinese Patent Application No. XW2014000220, titled "An Enhanced Procedure for Calculating Dynamic Properties of High-performance DAC on ATE," filed on May 9, 2014, which is herein incorporated by reference in its entirety.

TECHNICAL FIELD

Embodiments of the present disclosure relate generally to integrated circuit (IC) testing, and in particular to signal processing in IC testing.

BACKGROUND

In general, in testing an analog circuit or a mixed-signal circuit, the measurement of analog signals is challenging because analog signals are likely to be affected by noise. Further, the accuracy and stability of sampling in the recipient side also directly influences the test result. From the viewpoint of signal processing, the analysis of the test output can be accelerated if the outputs are digitized signals. Besides, the digitized signals are less likely to be distorted during transmission. Moreover, an external Automatic Test Equipment (ATE) can also process the digitized signals more efficiently.

A digital-analog converter (DAC) is a device that converts a digital, usually binary, signal to an analog signal. One or more DAC modules are commonly integrated in a System-On-a-Chip (SOC). A typical test for a digital to analog converter (DAC) usually includes the following. The analog output terminal of a DAC under test is coupled to the input terminal of a measurement analog to digital converter (ADC). Digital control signals are sent to the input terminal of the DAC. The measurement ADC digitizes the output signals of the DAC and generates digital signals for analysis.

The development in semiconductor technologies has increasingly driven the resolutions and update rates of such DACs higher and higher. For instance, a DAC update rate can be over 1G samples per second (SPS) with resolution as high as 16 bits. This continuously poses challenges for SOC manufacturers for testing high performance DACs with high cost-efficiency and high accuracy.

A known approach to calculate frequency domain parameters from the captured testing data is "FSIR" (Fundamental Signal Identification and Removal) as presented in Akinori Maeda, "Method to Calculate Frequency Domain Parameters of the Non-coherent Waveform", Verigy Japan, Go/Semi Technical News Letter, March 2011. The entire content of the reference is incorporated by reference herein. This method estimates a fundamental signal through the Tabei-Ueda algorithm and subtracts it from the original waveform in a time domain. Then the residual waveform is converted to frequency domain and the harmonics power and noise power are calculated. However, this approach does not take into account the offset of the harmonic bins, which leads to significant errors in the total harmonic distortion (THD) calculations since the harmonics are treated as noise.

An approach to estimate a non-periodic signal is "FXT" (Fourier Transform Extension) presented in Fang Xu, "Close-in Noise, and Its Application to Converter Test", IMTC 2006. The entire content of the reference is incorporated by reference herein. This method includes finding the Δphase of the first point and the last point of a captured waveform and removing it by multiplying $$e^{-j2\pi \frac{\Delta P}{N} i}.$$

Then the non-periodic signal is twiddled to a periodic signal without spectral leakages. The FXT method has improved statistic stability in production testing. However, its the application coverage is limited as a Δphase is estimated based on the whole spectrum of a captured signal and may lead to a significant error especially when a phase trend is not monotonic.

In addition, neither the FSIR nor the FXT approaches factors in drift of DC (direct current) offset which may occur in the real-life production environment. A DC drift may adversely affect the spectrum analysis which causes errors in the determination of frequency domain parameters.

Usually, two types of characteristics are tested in the production phase of a DAC module in an integrated circuit (IC) device, e.g., an SOC chip: the static properties and the dynamic properties. The most common static properties to be tested include Differential Non-Linearity (DNL) and Integral Non-Linearity (INL). For dynamic properties, on which embodiments of the present disclosure is focused, SNR (Signal to Noise Ratio) and THD (Total Harmonic Distortion) are most critical properties to be tested.

SNR is defined as a power ratio between the fundamental signal and the background noise. Both the signal and noise power are measured at the same or equivalent points within the same system bandwidth. If the signal and the noise are measured across the same impedance, an SNR can be obtained by calculating the square of the amplitude ratio:

$$SNR = \frac{P_{signal}}{P_{noise}} = \left(\frac{A_{signal}}{A_{noise}}\right)^2 \quad (1.1)$$

where P is the average power and A is the Root-Mean-Square (RMS) amplitude. Due to the wide dynamic range of signals, a logarithmic decibel scale is usually used to represent SNR:

$$SNR_{dB} = 10\log_{10}\left(\frac{P_{signal}}{P_{noise}}\right) = 20\log_{10}\left(\frac{A_{signal}}{A_{noise}}\right) \quad (1.2)$$

In such an SNR determination, harmonic distortion components are usually not considered. Equation (1.3) can be used to calculate SNR when an Automatic Test Equipment (ATE) digitizer is used to capture the waveform from a DAC under test.

$$SNR_{dB} = 20\log_{10}\left(\frac{A_{bin_M}}{\sqrt{\sum_{bin=1}^{\frac{N}{2}-1} A_{bin}^2}}\right), \; bin \neq kM, \, k = 1, 2, 3... \quad (1.3)$$

where M is the fundamental bin number and N is the samples number. Since after a Fast Fourier Transform (FFT), the positive half of spectrum is complex conjugate to the negative half, only the positive half needs to be processed and so the noise bins are calculated from 1 to N/2−1.

Total harmonic distortion (THD) is defined as the ratio of a sum of the powers of all harmonic components to the power of the fundamental frequency.

$$THD = \frac{\sum_{i=2}^{\infty} P_{harmonic\_bin\_i}}{P_{fundamental\_bin}} \quad (1.4)$$

In testing, it is impossible to analyze all of the innumerable harmonic components. Commonly a number of harmonics (R) to be included in the THD calculation is predefined. Same as SNR, a logarithmic decibel scale can be used to represent THD, e.g., $$THD_{dB} = 20\log_{10}\left(\frac{\sqrt{\sum_{i=2}^{R}(A_{harmonic\_bin\_i})^2}}{A_{fundamental\_bin}}\right) \quad (1.5)$$

Normally frequency domain parameters, like SNR and THD, are most important parameters to evaluate DAC performances. To derive these frequency domain parameters by Fourier Transform, a captured waveform in a time domain needs to have integer number of cycles. This condition is known as coherent sampling.

In production testing, a waveform output from a DAC under test can be captured by an ATE digitizer. Then FFT is applied to derive the frequency domain parameters. FFT is a powerful tool for spectrum analysis and its processing time is fast enough to satisfy the test time requirements of production. On the other hand, the condition of coherent sampling demands an integer number of periods in the waveform within one Unit Time Period (UTP).

An FFT calculation treats a sampled waveform as if it is repeated infinitely. However, if the coherent sampling condition is not met, discontinuity occurs when the waveform is repeated and there will be a large spectral leakage in spectrum analysis. FIG. 1 shows the simulation results of Fourier Transforms 103 and 104 of sinusoidal waveforms 102 and 102 which have 15 and 15.01 periods respectively. As shown, big smearing is present in the spectrum due to a fraction of a period, as shown in 102 and 104.

Unfortunately, due to the hardware and environment limitations, the coherent sampling condition can hardly be satisfied in DAC testing. In past decades, many techniques have been developed trying to solve this issue, such as window functions, time domain interpolation re-sampling and extension of Fourier Transform. Each of these techniques offers unique advantages but has only limited coverage.

Coherent sampling is generally expressed as Equation (1.6):

$$\frac{F_t}{F_s} = \frac{M}{N} \quad (1.6)$$

where $F_t$ is the signal frequency, $F_s$ is the sampling frequency of the digitizer, N is the number of sample points, and M is the periods of the measured waveform in the sampled data (N points). For example, when a sine wave (40 MHz) is measured with 253 periods by 2048 sampled points, the sampling frequency should be 323.794466 . . . MHz. In real-life, the relationship expressed by Equation (1.6) cannot be perfectly satisfied for certain reasons, such as inadequate precision in the frequency setting resolution, a fixed sampling frequency, or an unknown or unstable measured frequency.

The window function techniques can be employed to perform frequency domain analysis without requiring coherent sampling. FIG. 2 shows an example waveform before and after a window function is applied. The thin line 201 shows the original waveform and the bold line shows the processed waveform after the window function is applied (Hanning window). As can be seen, there is no discontinuity of the bold line 202 as the amplitude of waveform declines to 0.

Five types of window functions are commonly used for frequency analysis: Rectangular window, Hanning window, Hamming window, Blackman window and Flat-top window. FIG. 3 shows various window functions in a time domain. FIG. 4 shows the various window functions in a frequency domain.

However, each window function can give good results for only some, but not all, of the frequency domain parameters. For example, the Flat-top window function 301 and 401 results in correct amplitudes of spectrums but large errors in SNR. The Hanning 303 and 403 and the Blackman 302 and 402 window functions result in better SNR results but large errors amplitude determination.

SUMMARY

Therefore, it would be advantageous to provide a mechanism for automatically testing a device having an analog output, (e.g., a digital-to-analog converter (DAC)) with low spectral leakage and high cost-efficiency.

According to an embodiment of the disclosure, a method of signal processing comprises: (a) receiving an input signal and determining a plurality of frequency bins contained in the input signal; (b) generating an estimated signal based on estimated properties of a largest amplitude frequency bin, except for any direct current (DC) bin, of the plurality of frequency bins; (c) generating a reconstructed signal for a respective frequency bin of the plurality of the frequency bins based on the estimated properties; (d) subtracting the estimated signal from the input signal to generate a residual signal; and (e) repeating (a)-(d) for a number of frequency bins of the plurality of frequency bins.

According to an embodiment of the disclosure, a non-transitory computer-readable storage medium having instructions stored thereon, the instructions when being executed by one or more processors causing the one or more processors to perform a method of evaluating performances of a digital-analog converter (DAC) device. The method comprises: (a) receiving an input signal and determining a plurality of frequency bins contained in the input signal; (b) estimating properties of a largest amplitude frequency bin of the plurality of frequency bins to generate an estimated signal; (c) performing signal reconstruction on a respective frequency bin in a time domain based on the estimated properties of the respective frequency bin and generate a reconstructed signal thereof; (d) subtracting the estimated signal from the input signal to generate a residual signal; and (e) repeating foregoing (a)-(d) for a number of frequency bins of the plurality of the frequency bins.

According to an embodiment of the disclosure, a tester operable to test integrated circuit digital-analog converters (DACs) comprises: a digital pattern generator configured to provide a digital pattern to a DAC; a digitizer configured to receive an analog signal generated from the DAC in response to the digital pattern and to convert the analog signal into a digital signal; and a processing device. The processing device is configured to: (a) receive the digital signal as an input signal and determine a plurality of bins of the input signal; (b) estimate properties of a largest amplitude bin, except for direct current (DC) bin, in the input signal; (c) perform signal reconstruction in time domain based on the estimated properties to generate a reconstructed signal; (d) subtract the estimated signal from the input signal to get a residual signal; and (e) repeat (a)-(d) till a predetermined number of bins have been processed.

This summary contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

Embodiments of the present invention will be better understood from a reading of the following detailed description, taken in conjunction with the accompanying drawing figures in which like reference characters designate like elements and in which.

DETAILED DESCRIPTION

Figure 1:
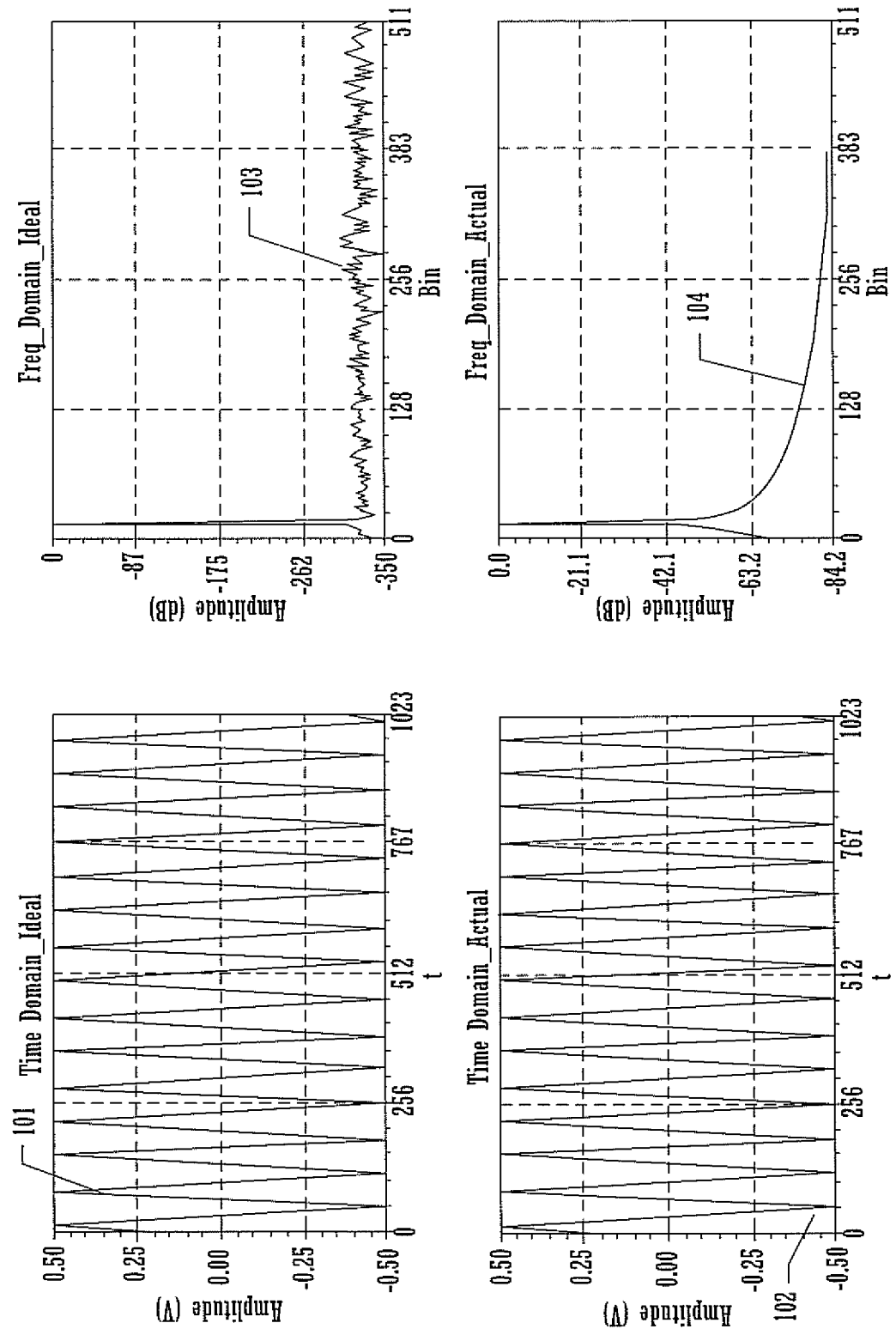
FIG. 1 shows the simulation results of Fourier Transforms of sinusoidal waveforms which are 15 and 15.01 periods respectively.
Figure 2:
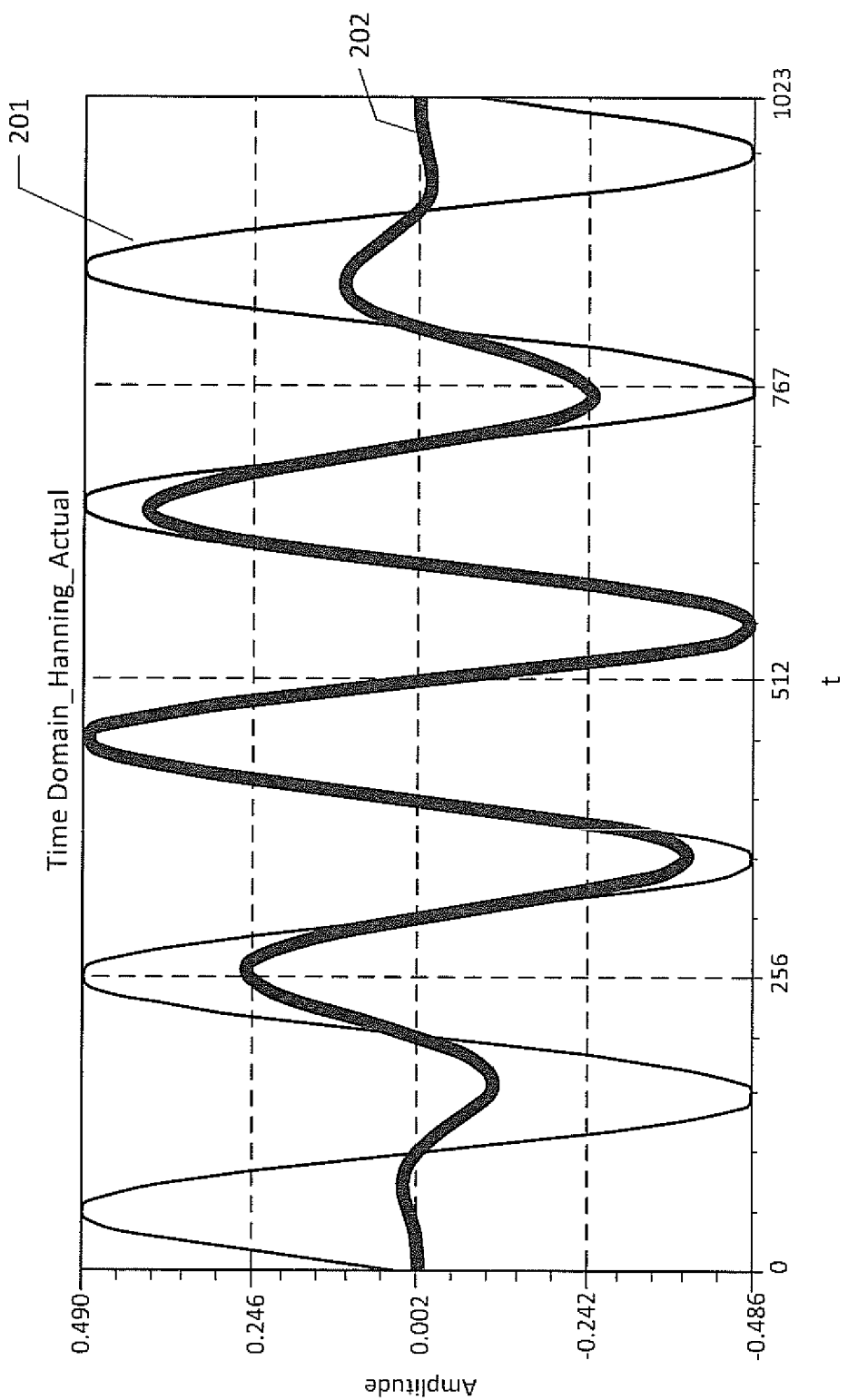
FIG. 2 shows an example waveform in which a window function is applied.
Figure 3:
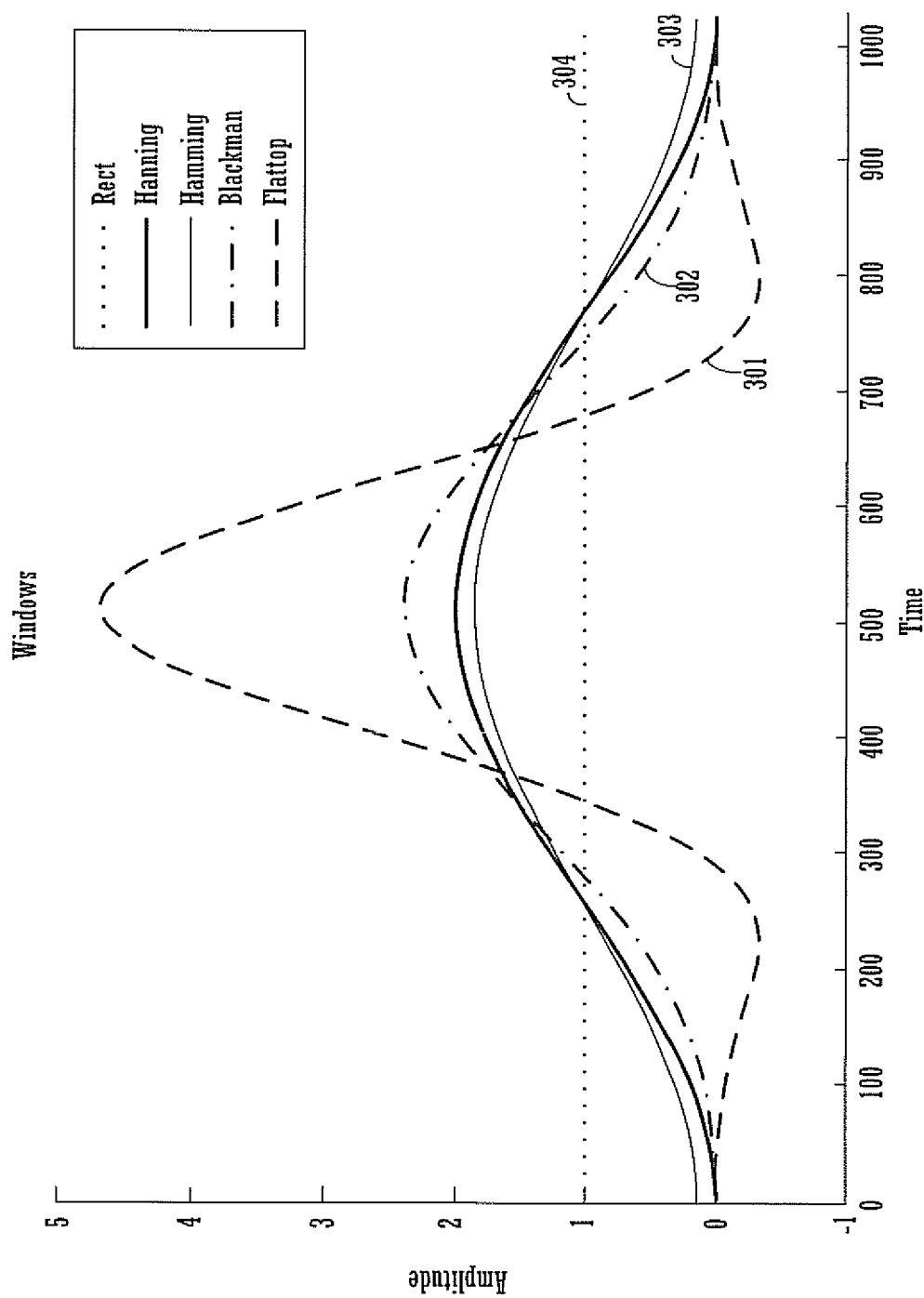
FIG. 3 shows five commonly used window functions in time domain.
Figure 4:
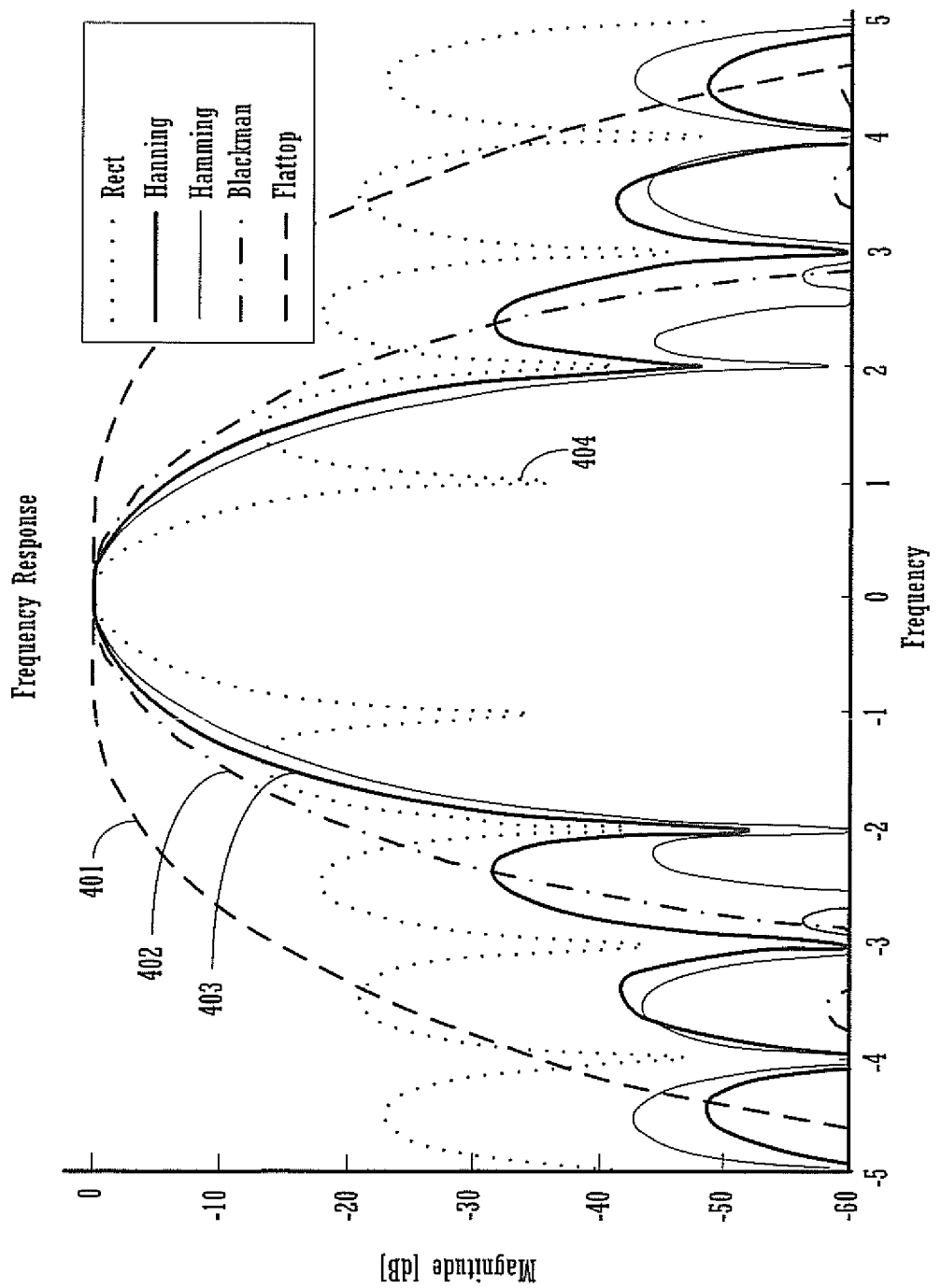
FIG. 4 shows the five commonly used window functions in frequency domain.

Reference will now be made in detail to the preferred embodiments of the present invention, examples of which are illustrated in the accompanying drawings. While the embodiments of the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation and Nomenclature

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or client devices. When a component appears in several embodiments, the use of the same reference numeral signifies that the component is the same component as illustrated in the original embodiment.

Method and System for Spectral Leakage Removal in DAC Testing

The terms "data," "signal" and "waveform" are used interchangeably in the present disclosure, wherever applicable.

Figure 5:
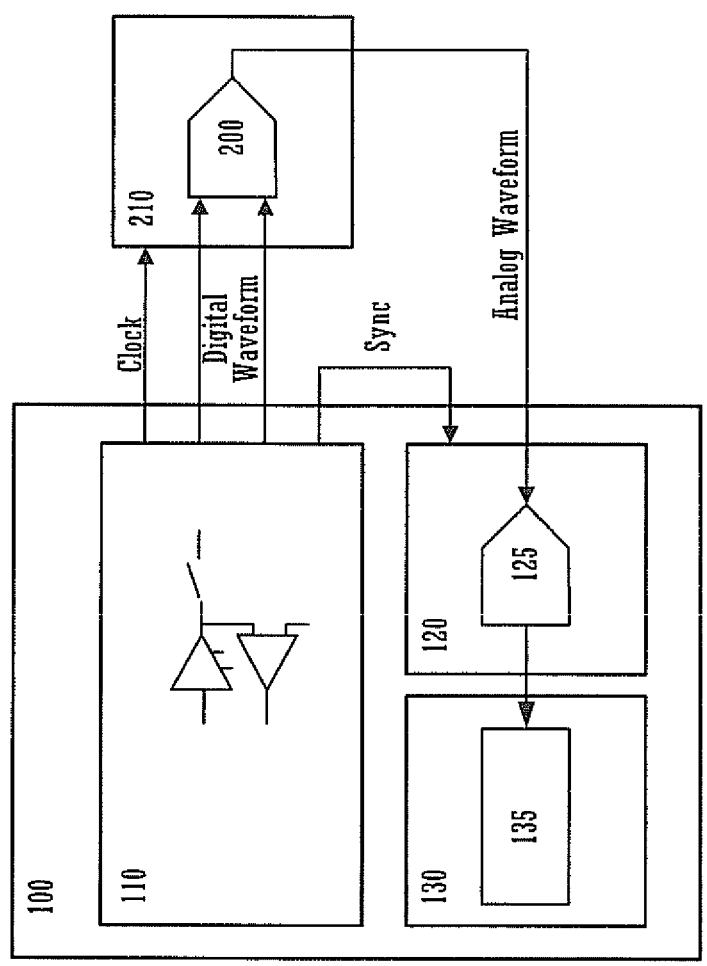
FIG. 5 shows an exemplary configuration of a DAC tester for testing an integrated circuit DAC in a device under test according to an embodiment of the disclosure.

FIG. 5 shows an exemplary DAC tester 100 for testing a DAC 200 integrated in an integrated circuit (IC) device under test (DUT) 210 according to an embodiment of the disclosure. The DAC tester 100 may include a digital pattern generator 110 and a digitizer 120. The digital pattern generator 110 is configured to send a digital pattern or waveform to the DAC 200 via the pins coupled to the DAC 200 as an input during testing.

After a digital-to-analog conversion performed by the DAC 200, an analog signal is output from the DAC 200 and sent to the digitizer 120. The digitizer 120 can convert the captured analog signal into a digital signal for processing and evaluation, e.g., by using an internal ADC (analog-digital converter) 125. In the illustrated embodiment, the DAC tester 100 includes a built-in processing device, e.g.

workstation 130, for the processing and evaluation of the converted digital signal. In some other embodiments, the processing device may be an external device coupled to the DAC tester 100.

In FIG. 5, the workstation 130 has a digital signal processor (DSP) 135 to process the converted digital signal. However it will be appreciated that the converted signal can be processed by any suitable software, hardware, firmware, or a combination thereof. In one embodiment, the digital pattern generator 110 can send a clock signal to the DUT 210, and/or a synchronization signal to the digitizer 120. For instance, the DAC tester 100 may be Advantest 93000 SOC Test system commercially available from Advantest America, Inc., San Jose, Calif., USA.

Figure 6:
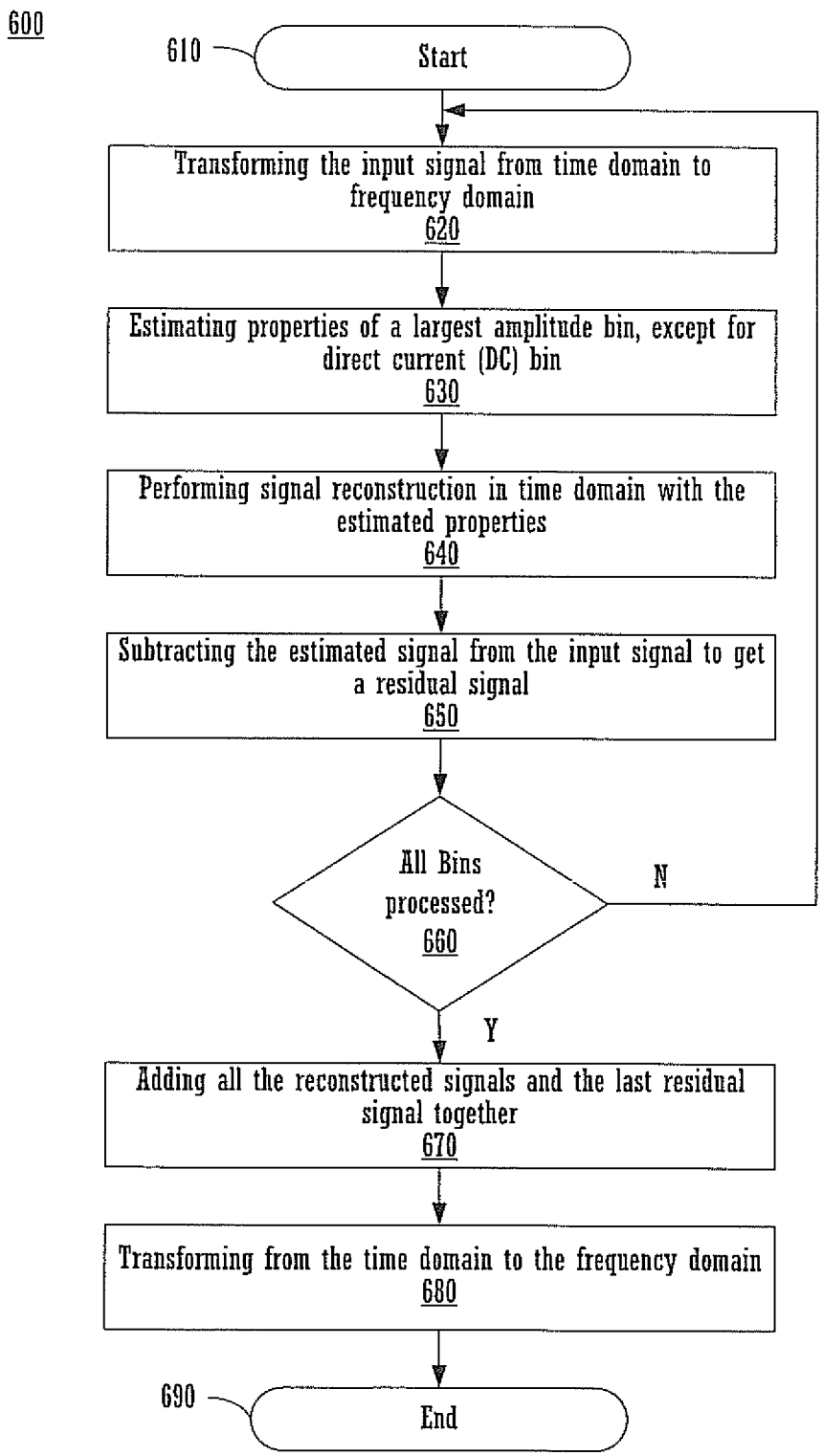
FIG. 6 is a flow chart showing an exemplary method of removing of the spectral leakage caused by non-coherent sampling in accordance with an embodiment of the present disclosure.

FIG. 6 is a flow chart showing the exemplary method 600 of DAC testing wherein spectral leakage can be reduced, or even eliminated, by timing adjustment according to an embodiment of the present disclosure. Method 600 can be implemented on a DAC tester, e.g., 100 in FIG. 1, and herein is referred to as "EFT" (Enhanced Fourier Transform). In one embodiment, the methods may be carried out by hardware logic in the DSP 135. Embodiments of the present disclosure may also be implemented as a computer readable medium having instructions stored thereon, the instructions, when being executed by one or more processors, causing the processors to perform the methods.

The method 600 starts at 610. In 620, an input signal is transformed from a time domain to a frequency domain signal having a plurality of frequency bins. This may be achieved by performing a FFT or DFT (Discrete Fourier Transform) on the input signal. The input signal may be the signal captured by the digitizer 120 or the signal subject to a level adjustment process as described in the following. Since the DAC outputs are represented as real number data in the time domain, the transformed result are complex numbers in the frequency domain. As the positive half and the negative half of the spectrum are complex conjugates, the description herein only focuses on the positive part.

At 630, properties (e.g. frequency, amplitude, initial phase) of the largest amplitude bin, with DC Bin excluded, in the input signal are estimated. The properties can be estimated according to the Tabei-Ueda algorithm or any other suitable method, process, or algorithm that is well known in the art. The Tabei-Ueda algorithm is presented in Makoto TABEI and Mitsuhiro UEDA, "A Method of High Precision Frequency Detection with FFT", IEICE Transaction A, Vol. J70-A, No. 5, pp. 798-805, May 1987, which is incorporated by reference herein in its entirety. The estimated properties uniquely define a signal, which is referred to as an estimated signal.

At 640, signal reconstruction is performed in the time domain based on the estimated properties to generate a reconstructed signal. It will be appreciated that signal construction can be performed by any suitable method, process, or algorithm that is well known in the art. The frequency of the reconstructed signal is different from the estimated signal while their other properties are the same. More specifically, the estimated signal contains fractional periods within one UTP, while the reconstructed signal contains integer number of periods within one UTP. The process to reconstruct the signal is to be described in greater detail below.

At 650, the estimated signal is subtracted from the raw input signal to generate a residual signal which is processed through a FFT or DFT again.

At 660, it is determined whether all the bins in consideration have been processed, e.g., according to a predetermined bin number threshold. If not, the foregoing 620-650 are repeated. The number of bins to be processed according to the present disclosure may depend on the number of harmonics to be included for the THD calculation.

If it is determined at 660 that consideration predetermined number of bins have been processed, at 670, the reconstructed signals and the last residual signal are added together to generate a sum signal. At 680, the sum signal is transformed from the time domain to the frequency domain, and then the resulted spectrum is leakage free. The method ends at 690. Consequently, by timing adjustment, spectral leakage caused by non-coherent sampling can be reduced or even removed.

In practice, DC offset drift is often present in sampled signals, for example when DC blocking capacitors are inserted into the signal path on the DUT board. In some embodiments, the DAC output is AC-coupled to the next stage. This offset drift may be eliminated by spending a longer waiting time which, however, will increase the production time and cost. If the cause of DC offset drift is clear, e.g., from the board capacitor and not related to the DUT performance, this trend can be removed without any wait time. In one embodiment, level adjustment may be performed on the input signal to remove the DC offset drift from the captured signal. Level adjustment is also known as trend removal and described in Hideo Okawara, "Practical signal processing at mixed signal test venues—Trend removal, noise reduction, wideband signal capturing," VLSI Test Symposium (VTS), May 2011, which is incorporated by reference herein in its entirety. A level adjustment process may be implemented by a DSP for example.

Figure 7:
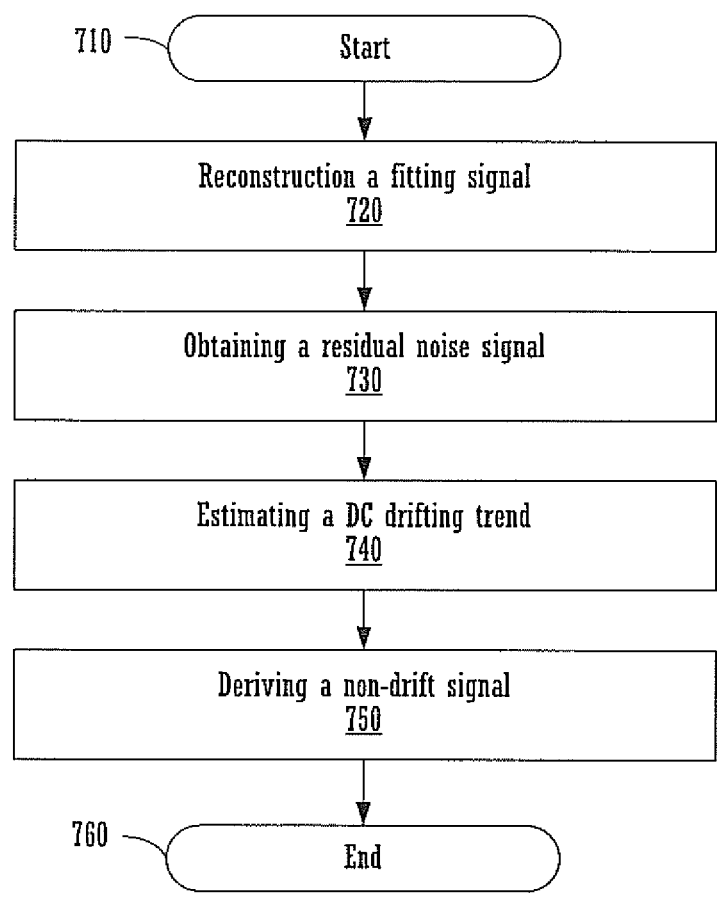
FIG. 7 shows an exemplary method of level adjustment according to an embodiment of the disclosure.

FIG. 7 shows an exemplary method 700 of level adjustment according to an embodiment of the present disclosure. Method 700 starts at 710. At 720, a fitting signal is reconstructed based on an original signal, e.g. for the signal captured by the digitizer 120. The reconstruction may be performed based on properties, such as frequency, amplitude and phase, that are estimated by the Tabei-Ueda algorithm. At 730, a residual noise signal is obtained by subtracting the fitting signal from the original signal. At 740, the DC drifting trend is estimated, for example by utilizing a least square curve fit method. At 750, the DC drifting trend is subtracted from the original signal to derive a signal without drift. The method 700 then ends at 760, and the signal with drift removed may be further processed in the timing adjustment method 600 described above as the input signal.

The following description mathematically analyzed the processes of signal processing according to the present disclosure. A real-valued periodic signal $\tilde{x}(t)$ can be expressed as:

$$\tilde{x}(t) = \sum_{i=0}^{M} A_i \cos(2\pi i f t + \varphi_i) \quad (4.1)$$

or $$\tilde{x}(t) = \sum_{i=0}^{M} A_i \frac{e^{j(2\pi i f t + \varphi_i)} + e^{-j(2\pi i f t + \varphi_i)}}{2} \quad (4.2)$$

where M is the highest harmonic in consideration, f is the fundamental frequency, $A_i$ is the amplitude of the $i^{th}$ harmonic, and $\varphi_i$ is the phase of the $i^{th}$ harmonic. Since the positive and negative components of the spectrum are complex conjugates, only the positive components in equation (4.2) are used for the calculation in this example:

$$x(t) = \sum_{i=0}^{M} A_i \frac{e^{j(2\pi i ft + \varphi_i)}}{2} \quad (4.3)$$

Sampling the signal $\tilde{x}(t)$ under the Nyquist theorem condition, the time domain signal $x(n)$ can be expressed as:

$$x(n) = x(n\Delta t) = \sum_{i=0}^{M} A_i \frac{e^{j(2\pi i fn\Delta t + \varphi_i)}}{2} \quad (4.4)$$

The time domain signal $x(n)$ is then converted to a frequency domain through a DFT process:

$$X(k) = X(k\Delta f) = \sum_{n=0}^{N-1} x(n\Delta t) e^{-j2\pi \frac{nk}{N}} \quad k = 0, 1, \ldots, N-1. \quad (4.5)$$

where $\Delta f = 1/(N\Delta t)$ represents the frequency resolution.

Then harmonics can be expressed in terms of spectrum as $$f_i = if = \frac{C_i}{N\Delta t} = C_i \Delta f = ([C_i] + \delta_i)\Delta f. \quad (4.6)$$

where $C_i$ is the number of cycles within the sampling time $N\Delta t$. For coherent sampling, $C_i$ is an integer. While for non-coherent sampling, $C_i$ is not an integer and can be expressed in this case as $C_i = [C_i] + \delta_i$, where $[C_i]$ represents the closet integer to $C_i$ and $\delta_i$ is fractional portion of $C_i$.

Thus, $$X(k) = \sum_{n=0}^{N-1} x(n\Delta t) e^{-j2\pi \frac{nk}{N}} \quad (4.7)$$

$$= \frac{1}{2} \sum_{n=0}^{N-1} \sum_{i=0}^{M} A_i e^{j(2\pi i fn\Delta t + \varphi_i)} e^{-j2\pi \frac{nk}{N}}$$

$$= \frac{1}{2} \sum_{i=0}^{N-1} A_i e^{j\varphi_i} \sum_{n=0}^{N-1} e^{j\frac{2\pi}{N}(C_i - k)n}$$

Substituting Equation (4.6) into Equation (4.7), it can be obtained that $$X(k) = \frac{1}{2} \sum_{i=0}^{M} A_i e^{j\varphi_i} \sum_{n=0}^{N-1} e^{j\frac{2\pi}{N}([C_i]-k)n} e^{j\frac{2\pi}{N}\delta_i n} \quad (4.8)$$

wherein in Equations (4.6) and (4.8), $\delta_i \in [-0.5, +0.5]$.

Then $$e^{j\frac{2\pi}{N}\delta_i n}$$

is expressed by a L-function:

$$L(\delta_i, n) = e^{j\frac{2\pi}{N}\delta_i n} \quad (4.9)$$

As seen from (4.9), if $\delta_i$ is not zero, then $L(\delta_i, n)$ is a non-periodic function which would cause spectrum leakage. To eliminate the leakage, an inverse-L function can be used as a compensation factor:

$$L(-\delta_i, n) = e^{-j\frac{2\pi}{N}\delta_i n} \quad (4.10)$$

Performing IDFT (Inverse Discrete Fourier Transform) on the positive part of spectrum Equation (4.5), it can be obtained that $$\tilde{x}(n) = IDFT(X(k)) = \sum_{i=0}^{M} A_i \frac{e^{j(2\pi i fn\Delta t + \varphi_i)}}{2} \quad (4.11)$$

Multiplying Equation (4.11) with Equation (4.10), the adjusted complex waveform in time domain can be expressed as $$x_{adjusted}(t) = \tilde{x}(t) * L(-\delta_i, n) \quad (4.12)$$

$$= \sum_{i=0}^{M} \frac{A_i}{2} e^{j(2\pi i fn\Delta t + \varphi_i) - j\frac{2\pi}{N}\delta_i n}$$

$$= \sum_{i=0}^{M} \frac{A_i}{2} e^{j\left(\frac{2\pi}{N}n(C_i - \delta_i) + \varphi_i\right)}$$

$$= \sum_{i=0}^{M} \frac{A_i}{2} e^{j\left(\frac{2\pi}{N}n([C_i] + \delta_i - \hat{\delta}_i) + \varphi_i\right)}$$

From Equation (4.12), it is clear that if $\hat{\delta}_i = \delta_i$, the spectral leakage will be eliminated.

If a captured waveform has a fractional period within one UTP, it means that sampling is not coherent and potentially large spectral leakage may occur in the spectral analysis. The frequency, amplitude and phase of the test signal can be characterized, for example by the Tabei-Ueda algorithm through FFT using a Hanning window and interpolation. The Tabei-Ueda algorithm is briefly described as below.

An FFT is performed on the captured waveform by using a Hanning window. A local maximum bin ($k_{max}$) and the second maximum bin ($k_{max}-1$ or $k_{max}+1$) are searched. The parameter $\Delta k$ is calculated by Equation (4.13) where $k_{neighbor}$ is set as the second maximum bin:

$$\Delta k = \left| \frac{1 - 2\left(\frac{V k_{neighbor}}{V k_{max}}\right)}{1 + \left(\frac{V k_{neighbor}}{V k_{max}}\right)} \right| \quad (4.13)$$

In Equation (4.13), $Vk_{neighbor}$ and $Vk_{max}$ represent the amplitudes of the bins $k_{max}$ and $k_{neighbor}$, respectively Based on $\Delta k$, the signal frequency, amplitude and phase are calculated by using equations (4.14)-(4.16), as shown in the following.

Frequency (Freq):
 If $k_{max} > k_{neighbor}$, then $k = k_{max} - \Delta k$
 If $k_{max} < k_{neighbor}$, then $k = k_{max} + \Delta k$
 Then Freq=k*Δf where Δf is the frequency resolution (4.14).

Amplitude (Amp):

$$\text{Amp} = V_{k_{max}} * \frac{\pi \Delta k}{\sin(\pi \Delta k)} * (1 - \Delta k^2) \quad (4.15)$$

Initial Phase (Phase):

$$\text{Phase} = \frac{1}{2\pi} \arctan(\text{Amp}_{k_{max}} * e^{-j2\pi \Delta k}) \quad (4.16)$$

Under a non-coherent sampling condition, not only the fundamental bin, but also the harmonic bins contain offset in the spectrum. In general, the bin offset of the harmonics can be expressed as $$\hat{\delta}_i = \frac{\hat{\delta}_{fundamental}}{k_{fundamental}} * k_i \quad i = 1, 2, \ldots, M \quad (4.17)$$

where i is the harmonic number, $k_i$ is the $i^{th}$ harmonic bin and M is the maximum number of harmonics to be included for the THD calculation.

To reconstruct the signal in a time domain according to the properties estimated by Tabei-Ueda method, Equation (4.18) is used.

$$\text{Signal}_i = \text{Amp}_i * \cos\left(2\pi * \frac{t}{N} * \text{Bin}_i + \text{Phase}_i\right) \quad (4.18)$$

where $$\text{Bin}_i = \lfloor k_i - \hat{\delta}_i + 0.5 \rfloor \quad (4.19)$$

which represents the nearest integer number to $$(k_i - \hat{\delta}_i + 0.5)t$$

A DAC test method according to the embodiment of the disclosure has been validated through comparison with other methods against a paper benchmark. Validation experiments presented herein are performed both by simulation and on physical SOC devices. The following presents the experiment results obtained at different setup conditions.

(1) Offset Bin changes, other parameters are fixed.

TABLE 1

Setup of different offset bin

| Items | Setup |
| --- | --- |
| DAC Resolutions | 10 Bits (Sample_num: 4096) |
| Fundamental Bin | 101 |
| Offset Bin | −0.4~+0.4, step 0.1 |
| Harmonic Order in THD calculation | 5 |
| Noise added | Yes |
| Harmonics added | Yes |
| Spur added | No |

Figure 8:
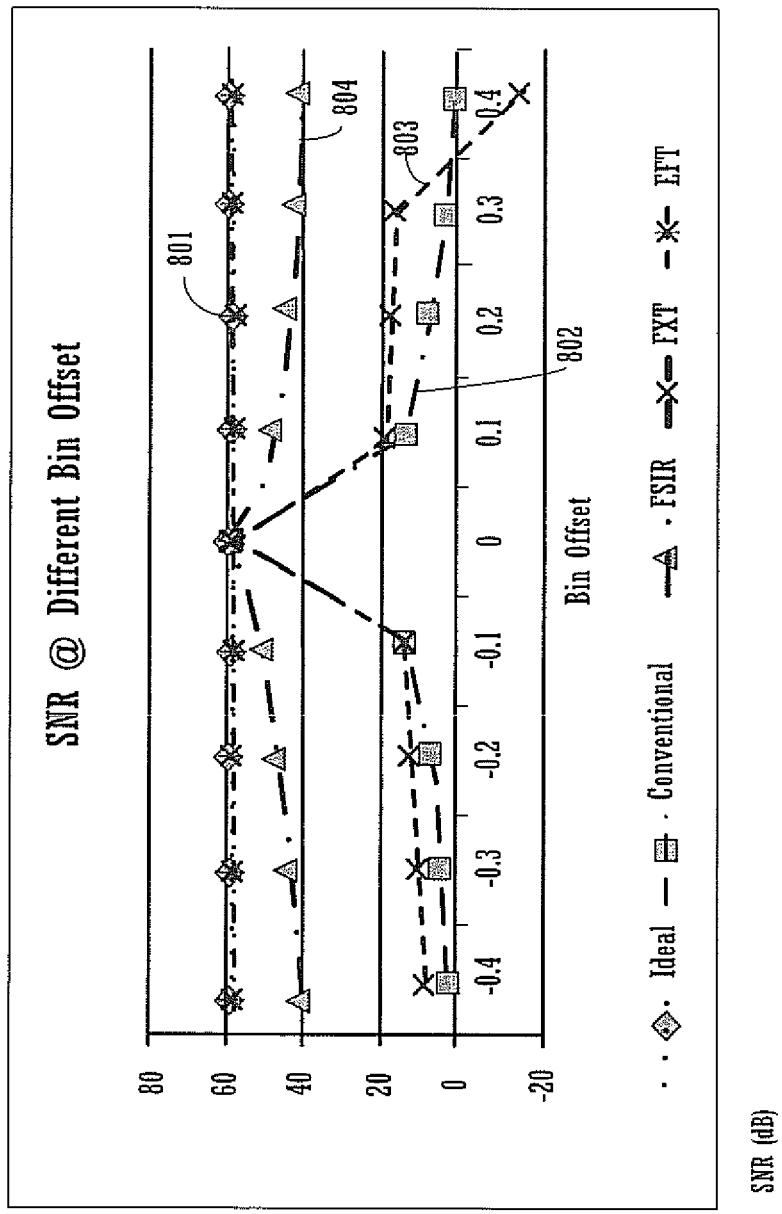
FIG. 8 shows sample SNR results with different methods in a first simulation.

FIG. 8 are data plots showing sample SNR results as a function of bin offset that are derived from various conventional method of signal processing in DAC testing and from an embodiment of the present disclosure. The Bin offset in the horizontal axis is in the unit of signal period. As demonstrated, the EFT 801 has improved coverage with respect to bin offset, from −0.4*period to +0.4*period. The conventional method 802 (FFT directly without any post processing) and FXT 803 are only applicable to a small range around zero bin offset. The results from FSIR 804 are stable across the bin offset range but the difference from the ideal value is obvious. This is caused by treating the harmonic bins as noise bins due to the non-coherent sampling.

Figure 9:
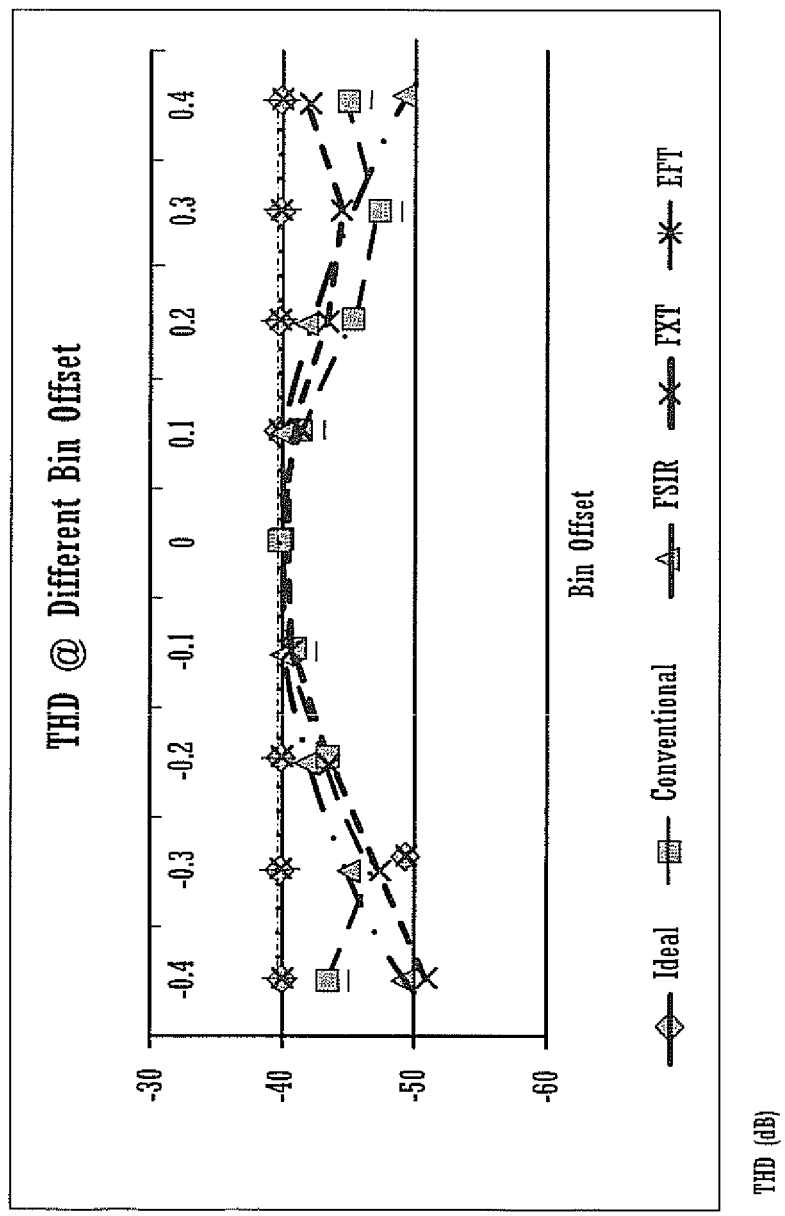
FIG. 9 shows sample THD results with different methods in the first simulation.

FIG. 9 are data plot showing the sample THD results as a function of bin offset that are derived from various conventional methods of signal processing in DAC testing and from an embodiment of the present disclosure. Again, the EFT method is capable of accurately reflecting the actual characteristics.

Figure 10:
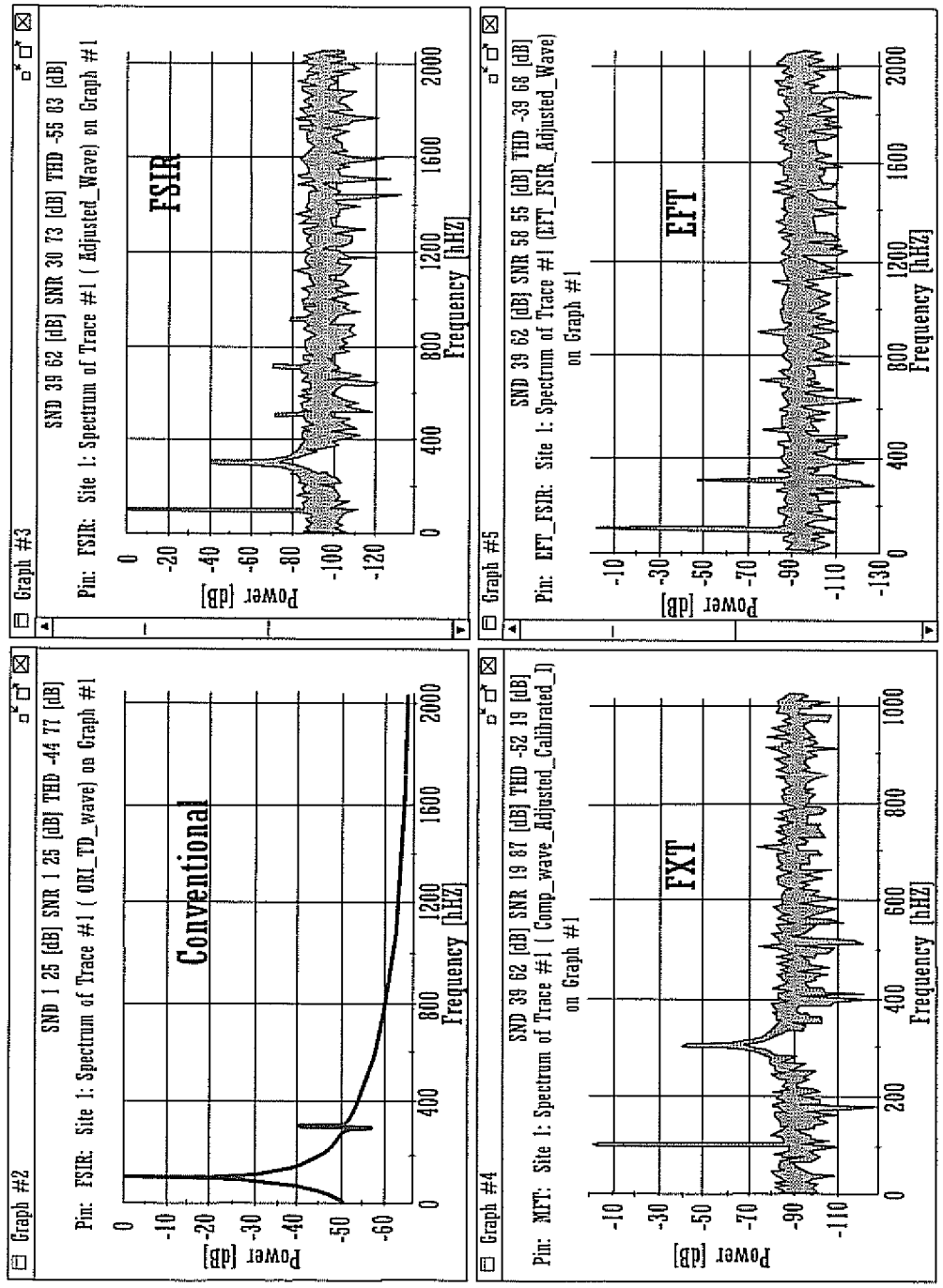
FIG. 10 shows sample reconstructed spectrums of different methods in the first simulation.

FIG. 10 shows the sample spectrums resulted derived from various conventional methods of signal processing in DAC testing and from an embodiment of the present disclosure. In this experiment, a third harmonic is inserted in the signal. It is demonstrated that EFT has the unique ability to identify the fundamental bin and third bin correctly and reconstruct the signal without spectral leakage.

(2) Resolution changes: 8 bits~18 bits, others fixed.

TABLE 2

Setup of different DAC resolution

| Items | Setup |
| --- | --- |
| DAC Resolutions | 10-18 Bits |
| Fundamental Bin | 101 |
| Offset Bin | −0.3 |
| Harmonics Order | 5 |
| Noise | Yes |
| Harmonics | No |
| Spur | No |

Figure 11:
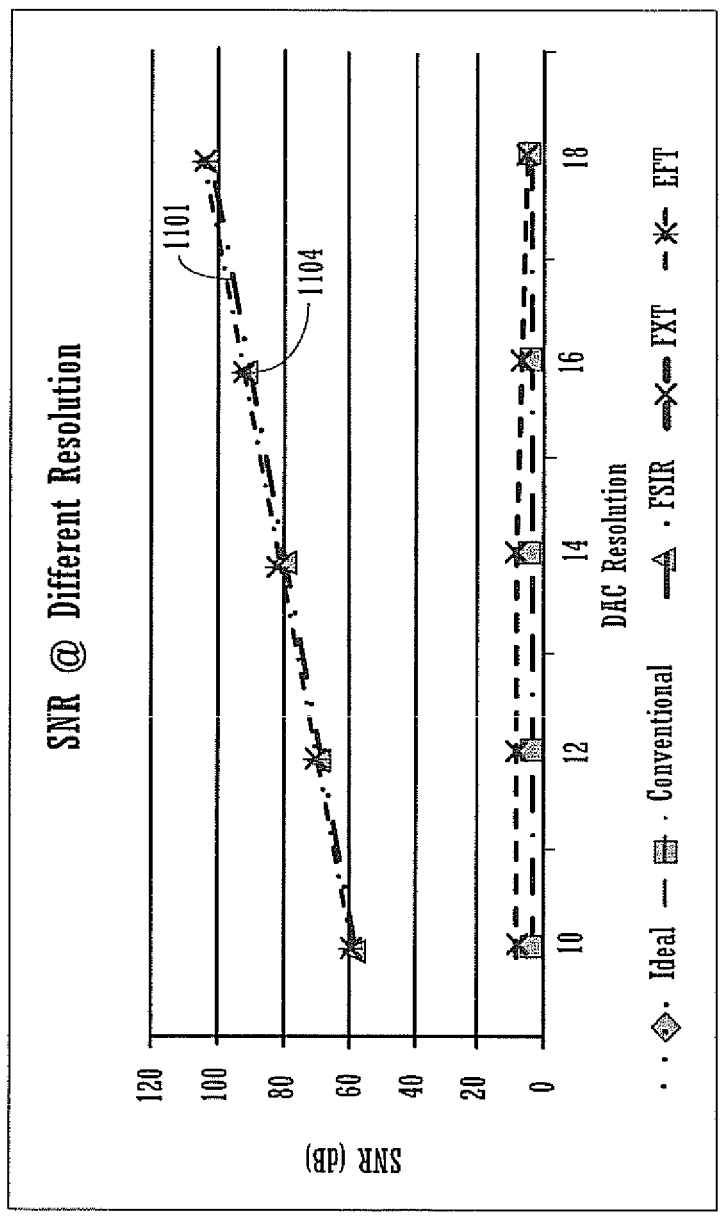
FIG. 11 shows sample SNR results with different methods in a second simulation.

FIG. 11 are data plot showing the sample SNR results as a function of DAC resolution that are derived from various conventional methods of signal processing in DAC testing and from an embodiment of the present disclosure. It is shown that if there is no harmonic component, both FSIR (data shown by 1104) and EFT (data shown by 1101) can lead to SNR correctly.

Figure 12:
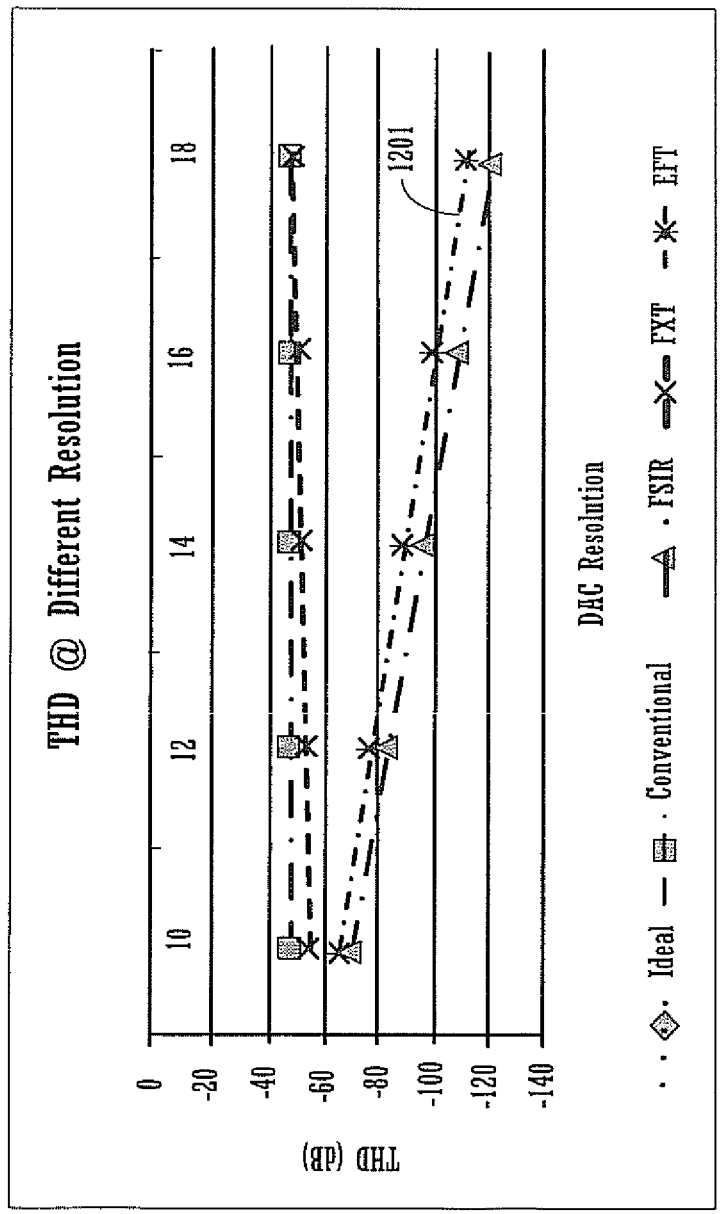
FIG. 12 shows sample THD results with different methods in the second simulation.

FIG. 12 are data plot showing the sample THD results as a function of DAC resolution that are derived from various conventional methods of signal processing in DAC testing and from an embodiment of the present disclosure. It is shown that that as harmonics estimation is included in EFT (data shown in 1201), THD can be accurately estimated, while other approaches cannot achieve this.

(3) Fundamental Bin changes: 5~N/10−1, others fixed.

TABLE 3

Setup of different fundamental bin

| Items | Setup |
| --- | --- |
| DAC Resolutions | 10 Bits (Sample size: 4096) |
| Fundamental Bin | 5-2005 |
| Offset Bin | −0.3 |
| Harmonic Order in THD calculation | 5 |

TABLE 3-continued

Setup of different fundamental bin

| Items | Setup |
| --- | --- |
| Noise | Yes |
| Harmonics | Yes ($3^{rd}$ harmonic) |
| Spur | No |

Figure 13:
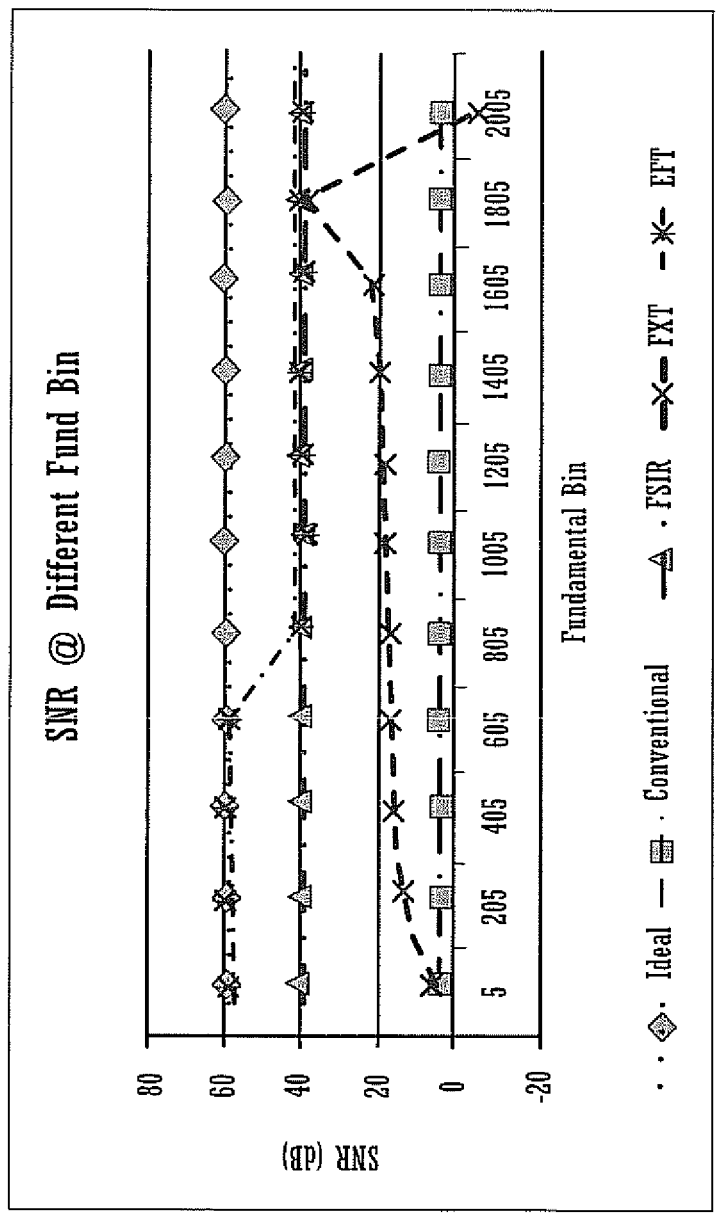
FIG. 13 shows sample SNR results with different methods in a third simulation.
Figure 14:
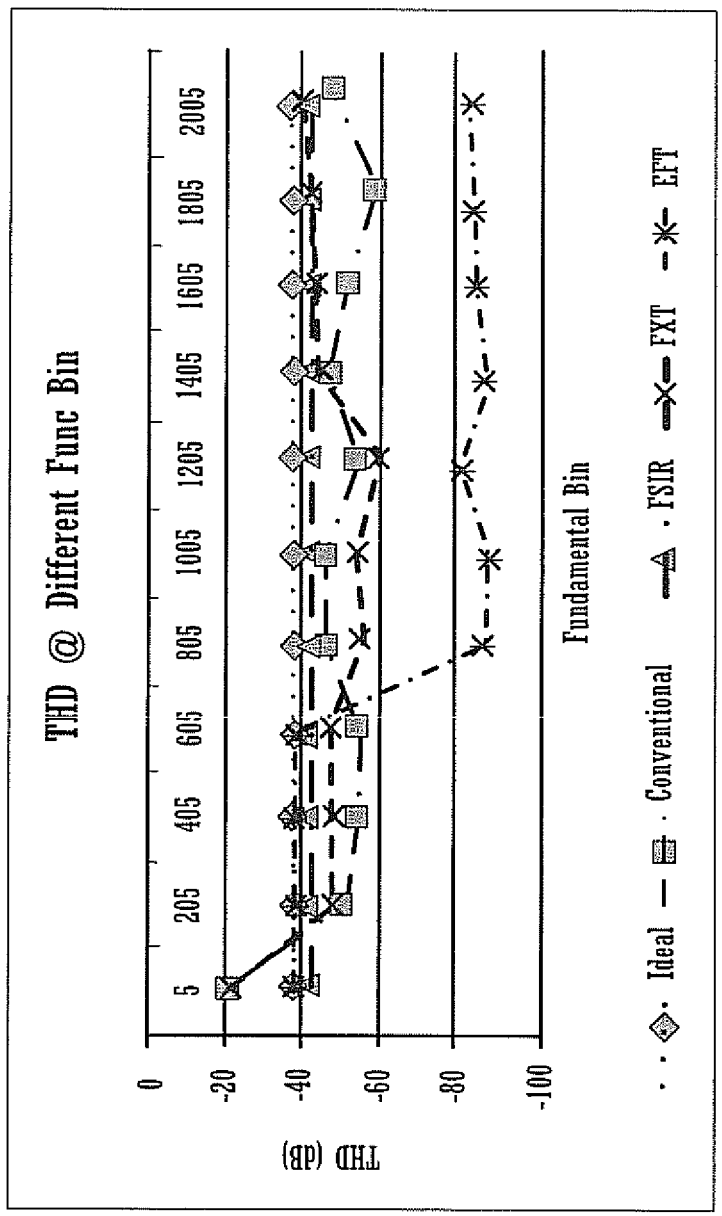
FIG. 14 shows sample THD results with different methods in the third simulation.

FIG. 13 are data plot showing sample SNR results as a function of fundamental bin that are derived from various conventional methods of signal processing in DAC testing and from an embodiment of the present disclosure. FIG. 14 are data plot showing sample THD results as a function of fundamental bin that are derived from various conventional methods of signal processing in DAC testing and from an embodiment of the present disclosure. In an embodiment it is possible to add some specially designed post-processing to handle the folded harmonic bins.

To evaluate the accuracy and test time of proposed procedure, a smart phone baseband device is used as an experimental sample. There is a DAC for the GSM Transmitter in this SOC device and its SNR and THD are measured. The detailed specification is listed in Table 4.

TABLE 4

Setup of actual DAC in 3G baseband device
DAC of 3G Baseband Device

| Resolution | 12-Bit | |
| --- | --- | --- |
| DAC Update Rate | 1MSPS | |
| Digitizer Samples Number | 8192 | |
| Digitizer Actual Sampling Rate | 0.98753357716MSPS (80.9901123cycles) | Non-coherent sampling |
| Ideal | 0.987654320987654MSPS (81 cycles) | Coherent Sampling |

Figure 15:
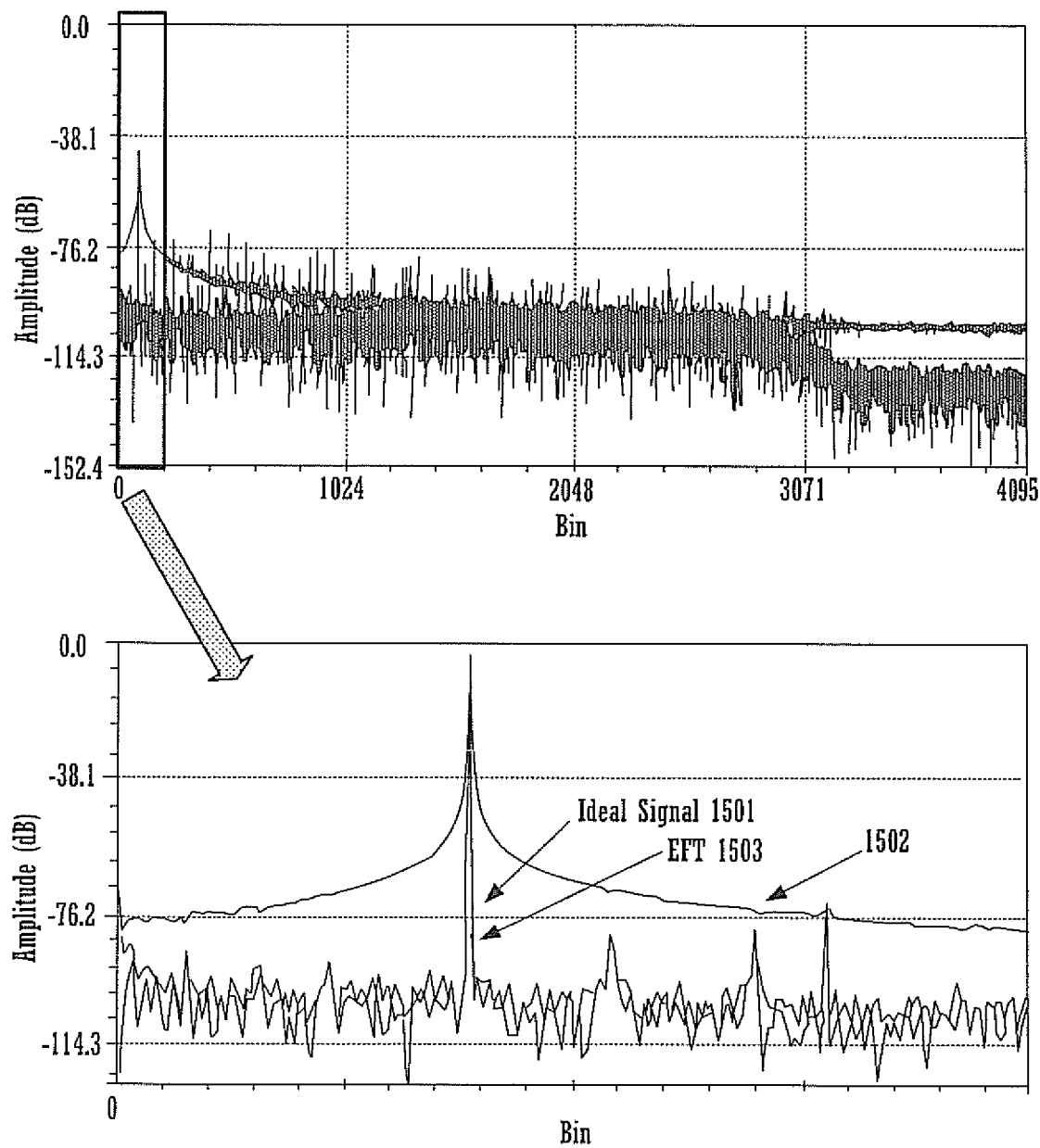
FIG. 15 shows sample spectrums of a real DAC device experiment.

FIG. 15 shows sample spectrums obtained on a real DAC device experiment in accordance with an embodiment of the present disclosure. The top one shows an overview, and the bottom one shows zoom-in of fundamental bin.

The "Ideal Signal" line 1501 represents the spectrum under the coherent sampling condition. The "Conventional" line 1502 shows the spectrum under non-coherent sampling condition, with FFT and rectangular window (sampling rate=0.98753357716M SPS). The "EFT" line 1503 shows the spectrum under non-coherent sampling condition with the EFT process according to an embodiment of the present disclosure.

As shown in FIG. 15, by employing EFT, the spectrum leakage is removed and even the spurs are reconstructed near perfectly. The accuracy error of the EFT result is less than 1%, as shown in Table 5.

TABLE 5

Result of DAC testing in 3G baseband device

| Item | Ideal | Conventional | EFT |
| --- | --- | --- | --- |
| SNR (dB) | 62.87 | 34.92 | 62.86 |
| THD (dB) | −68.40 | −66.49 | −68.42 |

From the time analysis shown in Table 6, the test time of the EFT process according to an embodiment of the disclosure is only 3.3 ms with 1 Tone estimation and 14.3 ms with 5 Tones estimation (array length: 8192), so it is cost-effective enough in production. Furthermore, on a modern ATE test platform, the calculation time can be hidden by other execution items, so that the proposed procedure is cost effective in mass production.

TABLE 6

Test time analysis of DAC testing with EFT procedure

| Tone Number | Data Capture (ms) | EFT (ms) |
| --- | --- | --- |
| 1 Tone | 8.6 | 3.3 |
| 5 Tones | 8.6 | 14.3 |

The EFT process according to an embodiment of the disclosure is capable of removing the spectral leakage due to non-coherent sampling in DAC testing so that the frequency domain parameters can be calculated correctly. The simulation and experimental results have proven that this process has both broad coverage and high accuracy. Since this procedure is able to handle more than one tone, it can inherently be used for multi-tone signal processing to get correct dynamic characteristics.

Besides the timing adjustment, the EFT process according to an embodiment of the present disclosure may also include the level adjustment to remove the effect of DC offset drift.

Because the Tabei-Ueda algorithm is used in this example, the accuracy of the results may be sensitive to the number of samples and the interference tones. In some embodiments, the number of samples is greater than 256 and it is twice greater than the bin of maximum harmonics component which is included for THD calculation. This helps solve the issue that the THD value would be degraded due to the bin folding.

Figure 16:
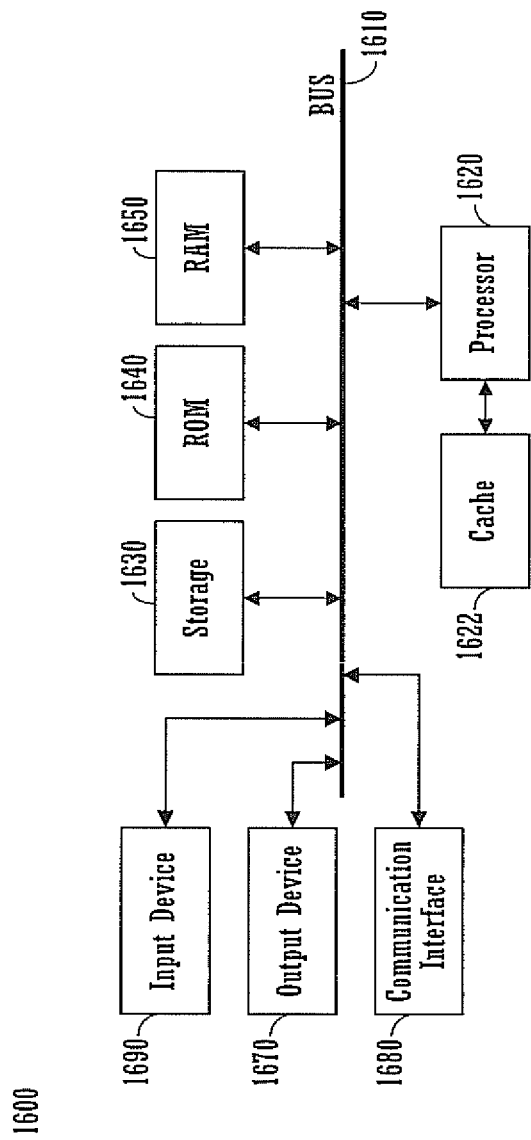
FIG. 16 is a block diagram showing the configuration of an exemplary processing device according to an embodiment of the disclosure.

FIG. 16 is a block diagram showing internal components of a processing device 1600, which may be the workstation 130, according to the embodiment of the disclosure. The processing device 1600 comprises a bus 1610 coupling various components as described below. The processing device comprises a processor 1620, which may be one or more central processing unit(s) each having one or more processing cores, graphical processing unit(s) or other processing element(s), and may be a DSP. The processing device 1600 may comprise a cache 1622 coupled to the processor 1620 or integrated as a part of the processor 1620. The processing device 1600 comprises a system memory, for example read only memory (ROM) 1640 and random access memory (RAM) 1 processing device 1600 may further comprise a storage 1630, which may be a non-volatile computer-readable medium, such as an optical disk, a magnetic disk (e.g. hard disk or floppy disk), an opto-magnetic disk, a flash memory, and the like. Data may be copied to the cache 1622 from storage 1630, ROM 1640 or RAM 1650 to avoid delay in the processor 1620 waiting for data and to thereby improve the overall performance.

The processing device 1600 may comprise at least one input device 1690 for interaction between a user and the processing device 1600. The input device 1690 may be, for example, keypad, mouse, motion input, image capturing element, gravity sensor, voice receiving element, touch screen, and so on. The processing device 1600 may comprise at least one output device 1670, which may be common output mechanisms as well known for those skilled in the art, e.g. speaker, beeper, flash light, image projecting element, vibration output element, a screen, or a touch screen. The processing device 1600 may comprise a communication interface 1680 for data communication in a wired or wireless manner. For example, the communication interface 1680 may comprise an antenna for transmitting and receiving data based on various cellular protocols, Wi-Fi, Bluetooth, infrared, or Near Field Communication (NFC), and/or comprise a hardware socket based on USB (including micro-USB, mini-USB, etc.), FireWire, HDMI, Lightning, and the like.

Embodiments of the disclosure have been described in detail with reference to the drawings, it should be noted nevertheless that the above is illustrative instead of restrictive. Those skilled in the art may recognize various modifications and alternatives within the scope of the disclosure, which is defined only by the appended claims instead of the specific embodiments described above.

What is claimed is:

1. A method of testing a digital-to-analog converter (DAC) device, the method comprising:
    performing a level adjustment on an input signal;
    receiving the input signal, wherein the input signal is a digital signal converted from an analog output signal of the DAC device;
    converting the input signal from a time domain to a frequency domain to determine a plurality of frequency bins contained in the input signal, wherein the input signal comprises a non-integer number of signal periods within one unit time period (UTP);
    processing the plurality of frequency bins in a descending order according to amplitudes of said plurality of frequency bins, wherein a frequency bin of a largest amplitude among said plurality of frequency bins is not a direct current (DC) bin, wherein processing a respective frequency bin of the plurality of frequency bins comprises:
        estimating properties of said respective frequency bin to produce estimated properties comprising frequency, amplitude and phase;
        generating an estimated signal for the respective frequency bin, wherein the estimated signal is defined by the estimated properties of the respective frequency bin and comprises a fractional number of signal periods within the one UTP;
        generating a reconstructed signal for the respective frequency bin based on the estimated properties, wherein the reconstructed signal comprises an integer number of signal periods within one Unit Time Period (UTP), wherein generating the reconstructed signal comprises rounding a function of the respective frequency bin and a bin offset thereof to a nearest integer number; and
        subtracting the estimated signal from the input signal to generate a residual signal for the respective frequency bin;
        performing Fourier transform to convert the residual signal from a frequency domain to a time domain;
    summing reconstructed signals of the plurality of frequency bins and a last residual signal of a last frequency bin of the plurality of frequency bins to generate a sum signal; and
    transforming the sum signal from the time domain to the frequency domain.

2. The method according to claim 1, wherein the estimated properties of the respective frequency bin are determined in accordance with a Tabei-Ueda method.

3. The method according to claim 1, wherein performing the level adjustment comprises:
    reconstructing a fitting signal based on an original signal;
    obtaining a residual noise signal by subtracting the fitting signal from the original signal;
    estimating a DC drifting trend; and
    subtracting the DC drifting trend from the original signal to derive the input signal.

4. The method according to claim 3, wherein the reconstructing the fitting signal comprises reconstructing the fitting signal based on frequency, amplitude and phase that are estimated in accordance with a Tabei-Ueda algorithm.

5. The method according to claim 3, wherein the estimating the DC drifting trend comprises estimating the DC drifting trend by utilizing a least square curve fit process.

6. A non-transitory computer-readable storage medium having instructions stored thereon, the instructions when executed by one or more processors cause the one or more processors to perform a method of evaluating performances of a digital-analog converter (DAC) device, wherein the method comprises:
    performing a level adjustment on an input signal;
    accessing the input signal and determining a plurality of frequency bins comprised in the input signal, wherein the input signal is a digital signal converted from an analog output signal of the DAC device, wherein the input signal comprises a non-integer number of signal periods within one unit time period (UTP);
    converting the input signal from a time domain to a frequency domain to determine a plurality of frequency bins contained in the input signal, and
    processing each of the plurality of frequency bins of the input signal in descending order according to amplitudes of the plurality of frequency bins, wherein a frequency bin with a largest amplitude among said plurality of frequency bins is not a direct current (DC) bin, wherein processing a respective frequency bin of the plurality of frequency bins comprises:
        estimating properties of the respective frequency bin to produced estimated properties thereof comprising frequency, amplitude and phase;
        generating an estimated signal for the respective frequency bin based on the estimated properties, wherein the estimated signal comprises a non-integer number of signal periods within the one UTP;
        generating a reconstructed signal for the respective frequency bin based on the estimated properties, wherein the reconstructed signal comprises an integer number of periods within one Unit Time Period (UTP), wherein generating the reconstructed signal comprises rounding a function of the respective frequency bin and a bin offset thereof to a nearest integer number; and
        subtracting the estimated signal from the input signal to generate a residual signal for the respective frequency bin;
    performing Fourier transform to convert the residual signal from a frequency domain to a time domain;
    summing reconstructed signals of the plurality of frequency bins and a last residual signal resulting from the processing into a sum signal; and
    transforming the sum signal from the time domain to the frequency domain.

7. The non-transitory computer-readable storage medium of claim 6, wherein the performing a level adjustment process comprises:
    reconstructing a fitting signal based on an original signal;
    obtaining a residual noise signal by subtracting the fitting signal from the original signal;
    estimating a DC drifting trend; and
    subtracting the DC drifting trend from the original signal to derive the input signal.

8. The non-transitory computer-readable storage medium of claim 7, wherein the reconstructing the fitting signal comprises reconstructing the fitting signal with frequency, amplitude and phase estimated by Tabei-Ueda algorithm.

9. A tester operable to test integrated circuit digital-analog converters (DACs), the tester comprising:
  a digital pattern generator configured to provide a digital pattern to a DAC;
  a digitizer configured to convert an analog signal to a digital signal, wherein the analog signal is generated from a DAC in response to the digital pattern and to convert the analog signal into a digital signal; and
  a processing device configured to:
    perform a level adjustment on an input signal;
    access the input signal and determining a plurality of frequency bins comprised in the input signal, wherein the input signal is a digital signal generated by the digitizer responsive to an analog output signal of the DAC device, wherein the input signal comprises a non-integer number of signal periods within one unit time period (UTP);
    convert the input signal from a time domain to a frequency domain to determine a plurality of frequency bins contained in the input signal, and
    process the plurality of frequency bins of the input signal in descending order according to amplitudes of the plurality of frequency bins, wherein a frequency bin with a largest amplitude is not a direct current (DC) bin, wherein processing a respective frequency bin of the plurality of frequency bins comprises:
      estimating properties of the respective frequency bin to produce estimated properties thereof, wherein the estimated properties comprise frequency, amplitude and phase;
      generating an estimated signal for the respective frequency bin based on the estimated properties, wherein the estimated signal comprises a non-integer number of signal periods within the one UTP;
      generating a reconstructed signal for the respective frequency bin based on the estimated properties, wherein the reconstructed signal comprises an integer number of periods within one Unit Time Period (UTP), wherein generating the reconstructed signal comprises rounding a function of the respective frequency bin and a bin offset thereof to a nearest integer number;
      subtracting the estimated signal from the input signal to generate a residual signal for the respective frequency bin; and
      performing Fourier transform to convert the residual signal from a frequency domain to a time domain;
    sum reconstructed signals of the plurality of frequency bins and a last residual signal resulting from the processing; and
    transform the sum signal from the time domain to the frequency domain.

10. The tester according to claim 9, wherein the digital pattern generator is configured to further send a clock signal to the DAC.

11. The tester according to claim 9, wherein the digital pattern generator is configured to send a sync signal to the digitizer.

* * * * *